United States Patent [19]
Monkowski et al.

[11] Patent Number: 4,916,083
[45] Date of Patent: Apr. 10, 1990

[54] HIGH PERFORMANCE SIDEWALL EMITTER TRANSISTOR

[75] Inventors: Michael D. Monkowski, Beacon; Joseph F. Shepard, Hopewell Junction, both of N.Y.

[73] Assignee: International Business Machines Corporation, Armonk, N.Y.

[21] Appl. No.: 318,984

[22] Filed: Mar. 6, 1989

Related U.S. Application Data

[62] Division of Ser. No. 48,346, May 11, 1987, Pat. No. 4,847,670.

[51] Int. Cl.$^4$ .......................................... H01L 21/265
[52] U.S. Cl. ...................................... 437/31; 437/203; 437/228; 437/225; 357/34; 357/59; 156/657
[58] Field of Search .................... 437/31, 32, 33, 225, 437/228, 233, 235, 162, 203; 357/34, 35, 59 H; 156/653, 657, 643

[56] References Cited

U.S. PATENT DOCUMENTS

| | | | |
|---|---|---|---|
| 4,234,357 | 11/1980 | Scheppele | 148/1.5 |
| 4,252,581 | 2/1981 | Anantha | 357/59 H |
| 4,319,932 | 3/1982 | Jambotkar | 148/1.5 |
| 4,338,138 | 7/1982 | Cavaliere et al. | 148/1.5 |
| 4,381,953 | 5/1983 | Ho et al. | 148/1.5 |
| 4,484,211 | 11/1984 | Takemoto | 357/59 H |
| 4,507,171 | 3/1985 | Bhatia et al. | 156/643 |
| 4,508,579 | 4/1985 | Gath | 437/228 |
| 4,521,952 | 6/1985 | Riseman | 29/590 |
| 4,531,282 | 7/1985 | Sakai et al. | 29/578 |
| 4,539,742 | 9/1985 | Kanzaki | 357/59 H |
| 4,545,114 | 10/1985 | Ita | 437/31 |
| 4,648,173 | 3/1987 | Malaviya | 437/31 |
| 4,778,774 | 10/1988 | Blossfeld | 357/34 |

FOREIGN PATENT DOCUMENTS 0083816 7/1983 European Pat. Off. .
0178000 4/1986 European Pat. Off. .

OTHER PUBLICATIONS

European Search Report EP 88 10 4842.

IBM TDB, vol. 27, No. 2, Jul. 1984, pp. 108–109, "Self-Aligned Bipolar Transistor".

Primary Examiner—Brian E. Hearn
Assistant Examiner—Kevin McAndrews
Attorney, Agent, or Firm—Jeffrey L. Brandt; T. Rao Coca

[57] ABSTRACT

A novel vertical bipolar device endowed with a lithography-independent tightly controlled submicron-wide emitter. In one embodiment, the emitter is contacted by a self-aligned conductive sidewall linked up to a horizontal conductive link. The extrinsic base, embedded within the collector, is recessed below and laterally spaced from the emitter by an insulator layer formed on the emitter sidewall. Transistor action is confined to the small emitter within the intrinsic base, the latter being contiguous with the extrinsic base. The base is contacted by means of a conductive self-aligned silicide formed on the extrinsic base. In a second embodiment, the emitter is of a desired shape with a correspondingly shaped contacting sidewall and pad integral structure. In a third embodiment, the emitter is ring shaped. In all embodiments, electrical contact to emitter is established at a distance laterally away from the transistor action area.

A novel process of forming vertical (e.g. NPN) bipolar device in which starting with a substrate having an N type epitaxial collector region, a horizontal layer composed of oxide-polysilicon dual layer with a substantially vertical surface is formed. P type intrinsic base precursor is formed in a surface portion of the collector. A submicron-wide sidewall of N doped polysilicon is established on the sidewall. By RIE, a surface portion of the exposed intrinsic base is removed to recess the would-be extrinsic base. An oxide insulator is formed on the sidewall by thermal oxidation and RIE, while simultaneously driving dopant from the sidewall into the intrinsic base thereunder, thereby forming the emitter with self-aligned polysilicon sidewall contact and delineating the intrinsic base.

32 Claims, 4 Drawing Sheets

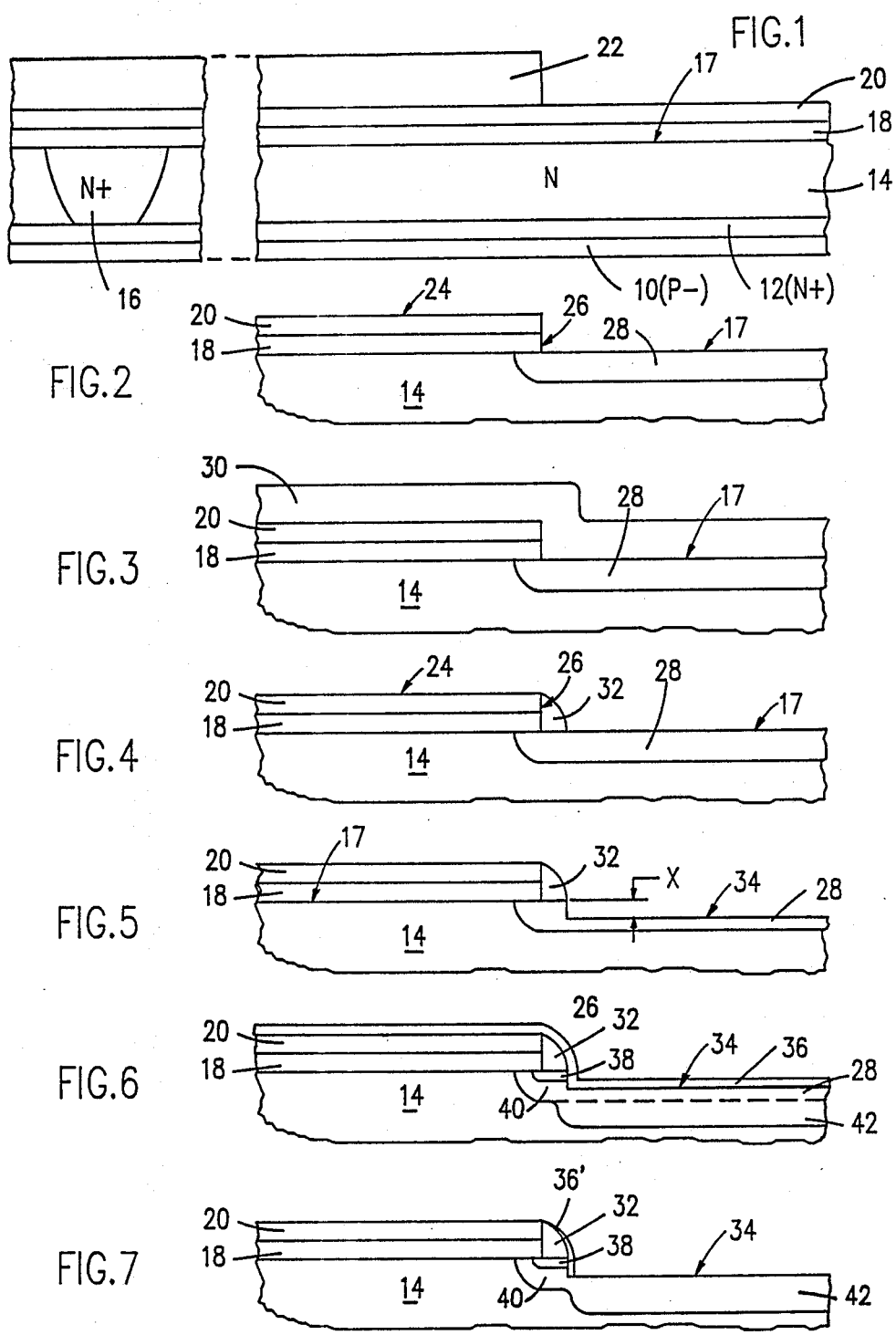

HIGH PERFORMANCE SIDEWALL EMITTER TRANSISTOR

This application is a divisional of Ser. No. 048,346, filed 5/11/87, now U.S. Pat. No. 4,847,670, issued 7/11/89.

The invention relates to a high performance bipolar transistor and more particularly to selfaligned bipolar transistor endowed with an emitter which is lithography-independent and of tightly controlled submicron width. It also relates to a method for making the same.

BACKGROUND OF THE INVENTION

In order to improve the performance of bipolar devices, extensive efforts have been made to develop new fabrication processes for producing smaller devices, spaced as close as possible, which, in turn result in both increased device density and higher switching speed (performance). The present state-of-the-art bipolar transistors capitalize on such features as extremely small and highly doped emitters, extrinsic and intrinsic base regions, self-alignment techniques to contact the emitter and base regions, to improve performance, reliability and manufacturing yields.

The emitter must be highly doped to reduce emitter resistance in order to maximize the transistor gain. The emitter must be extremely small to minimize the emitter-base capacitance. In addition to small emitter size, the transistor should have tight tolerance on that small size to facilitate better integrated circuit design. A small emitter coupled with tight tolerance results in a faster or high performance transistor.

The transistor's base area, which determines the (parasitic) base-collector capacitance, is one of the most significant parameters governing performance. In conventional bipolar transistors, where the base region is formed in a single process step, the active base is the portion of the base region directly below the emitter. The base contact is formed onto the inactive portion of the base region surrounding the emitter. In state-of-the-art bipolar devices, these two portions are formed according to two different processing steps to accommodate the need for having different dopant concentrations for both portions The active base which is lightly doped is called the intrinsic base, while the inactive base, which is highly doped in order to reduce the base resistance, is referred to as the extrinsic base.

Self-alignment is a technique used by the semiconductor industry to reduce size and improve yields. In its absence, for example, misalignment of the emitter region with respect to the base contact can result in variations in the extrinsic base resistance. In addition, this misalignment can also result in a higher emitter-base voltage at one side of the emitter than at the other. Self-alignment techniques appear to be absolutely necessary in the integrated circuit fabrication and is often combined with the use of doped polysilicon, taking advantage of its ability to be both a dopant source (e.g., for forming the extrinsic base) and/or a conductor.

Typical of the prior art, showing polysilicon self-alignment schemes for bipolar device fabrication are those described in U.S. Pat. No. 4,507,171 issued to Bhatia et al. and assigned to the present assignee and in the article entitled "Self-Aligned Bipolar Transistor" by J. F. Shepard published in IBM Technical Disclosure Bulletin, Vol. 27, No. 2, pp. 1008-1009, July 1984. These references describe use of doped polysilicon sidewall to form a self-aligned PN junction which is then contacted by a horizontal polysilicon layer. The junction so formed is used as emitter/collector of a lateral bipolar device or as the extrinsic base contact of a vertical bipolar device. U.S. Pat. Nos. 4,381,953 and 4,319,932, both assigned to the present assignee, disclose use of an insulator sidewall to self-align the emitter to base of a vertical bipolar transistor.

U.S. Pat. No. 4,531,282 issued to Sakai et al. describes a bipolar transistor having an extrinsic base formed from a doped polysilicon layer which also serves as self-aligned base contact encircling the emitter. An island shaped emitter is formed in the base region isolated from the base contact by an insulator extending between the periphery of the emitter and the base contact.

U.S. Pat. No. 4,338,138 issued to Cavaliere et al. and assigned to the present assignee, discloses a method of minimizing the extrinsic base area of a bipolar device to reduce the base-collector capacitance. The extrinsic base is formed by laterally diffusing dopant from a doped polysilicon layer which additionally serves as self-aligned base contact. Like in the Sakai et al. patent, the emitter is formed in the interior of the base.

U.S. patent application Ser. No. 626,279 which is assigned to the present assignee, discloses a self-aligned NPN transistor including a highly doped emitter separated on its sidewalls from the extrinsic base region by an N type guard ring shaped region having a significantly lower impurity concentration than the emitter. The guard ring is located beneath an insulating spacer.

U.S. Pat. No. 4,521,952 issued to Riseman and assigned to the present assignee discloses a method of making a vertical bipolar device having self-aligned silicide base contact. The intrinsic and extrinsic base regions are formed by ion implantation and the emitter is formed by out diffusion of dopant from a doped polysilicon layer.

U.S. Pat. No. 4,234,357 issued to Scheppele discloses use of doped polysilicon to form shallow emitters and serve as emitter contacts.

Despite the aforementioned prior art on polysilicon self-aligned bipolar transistors, there exists a need for a device in which the transistor action is confined to an extremely small area located away from the device contact regions. Since transistor action is limited to the emitter area (meaning the area of the emitter-base junction), such a device would have a small emitter, the size of which is not dependent on lithography limitations. Moreover, the small emitter size should be endowed with a tight tolerance. Another requirement of the transistor is that it have a minimal base-collector junction depth since such depth minimizes the base-collector capacitance. Yet another requirement is that the device have extremely low base and emitter contact resistances. The prior art has not been able to meet these collective requirements.

Accordingly, it is an object of the invention to provide a novel high performance bipolar transistor endowed with lithography-independent and tightly controlled submicron-wide emitter and a process for its fabrication.

SUMMARY OF THE INVENTION

Disclosed is a novel bipolar device provided with a shallow, submicron-wide, and highly doped first conductivity type (hereafter, referred to for brevity as N type) emitter which is fully separated from the extrinsic base which is of a second conductivity type (hereafter, P type). The extrinsic base, formed within the collector, is recessed below and spaced laterally away from the emitter with an insulator interposed therebetween. Recessing the extrinsic base in this fashion, substantially reduces the base-collector capacitance. The transistor action is limited to the small emitter embedded within the intrinsic base, the latter being contiguous with, but laterally spaced from the extrinsic base. The small emitter-base junction area results in a low emitter-base capacitance which improves device performance, emitter efficiency and current gain. Silicide electrical contact to emitter is established away from the region of transistor action by utilizing doped horizontal polysilicon layer in combination with a vertical polysilicon sidewall, the latter directly contacting the emitter. Self-aligned silicide contact with the extrinsic base is made in close proximity to the emitter to minimize emitter-base series resistance.

The novel method, in one embodiment thereof, includes forming on an N doped epitaxial silicon collector region, a dual, substantially horizontal layer composed of an insulator and N-doped polysilicon having at least one substantially vertical surface. Intrinsic base is formed in a surface portion of the collector. A submicron-wide sidewall of N-doped polysilicon having a width substantially corresponding to the desired width of the emitter is established on the vertical surface of the dual layer. Having protected the desired portion of the intrinsic base by means of the polysilicon sidewall, by anisotropic reactive ion etching (RIE) a substantial surface portion of the exposed intrinsic base is removed to recess the would-be extrinsic base region. By thermal oxidation, an oxide layer is formed on the horizontal polysilicon, sidewall and the recessed epi silicon. By RIE the oxide is removed from everywhere except the non-horizontal surfaces f the polysilicon sidewall. The extrinsic base is formed in the recessed silicon so as to be contiguous with the intrinsic base which lies under the sidewall. By thermal treatment, dopant from the polysilicon sidewall is diffused into a surface portion of the intrinsic base forming the emitter. Self-aligned silicide is formed on the exposed horizontal polysilicon layer and on the extrinsic base. Contacts to the emitter, extrinsic base and collector are established.

BRIEF DESCRIPTION OF THE DRAWINGS

The novel features, elements, process steps and their combination characteristic of the invention are set forth in the appended claims. The invention itself, however, will be best understood by reference to the detailed description which follows in conjunction with the accompanying drawings, wherein:

FIGS. 1-8 are cross-sectional representations of the sequential stages of fabrication of one embodiment of the sidewall emitter transistor in accordance with the invention culminating in the novel structure shown in FIG. 8.

DETAILED DESCRIPTION OF THE PREFERRED EMBODIMENTS

Figure 8:
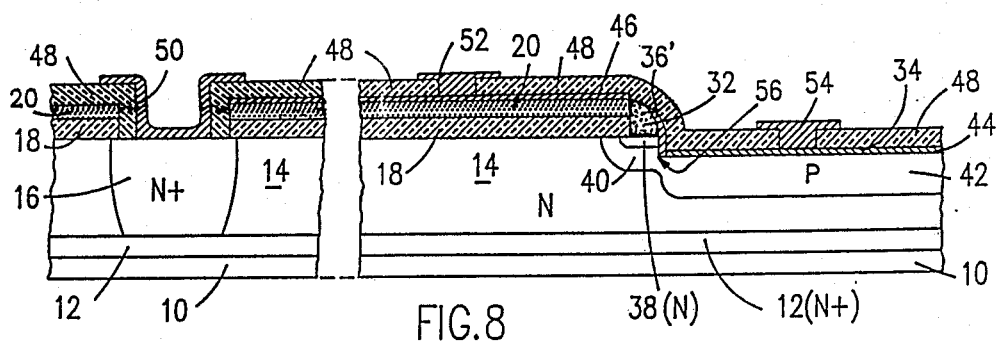

Referring now more particularly to FIGS. 1-8, there is illustrated the first embodiment for fabrication of self-aligned sidewall emitter transistor. The final transistor structure, illustratively a vertical NPN device, is shown in FIG. 8. The device structure consists of a P type silicon substrate 10 having an N+ subcollector region 12 and an N type epitaxial layer 14 serving as the collector of the transistor. Embedded in the surface portion of the collector 14 is a shallow P type base which is composed of an extrinsic base region 42 and an intrinsic base region 40. The extrinsic base region 42 is shallow and is recessed below the major surface 34 of the collector to minimize emitter-base capacitance and leakage current. Located within the intrinsic base region 40 and effectively separated from the extrinsic base region 42 by means of an oxide layer 36 is a shallow N type emitter 38 which is contacted, in self-aligned fashion, by means of N doped polysilicon sidewall 32. The base width in the active region (that is, the vertical distance between the emitter 38 and the collector 14) is made substantially the same as that in the parasitic sidewall area (that is, the lateral distance under the isolation oxide 18) between the emitter and the collector to avoid base punch-through and maximize current gain. Metal 52 makes ohmic connection to emitter 38 via the substantially horizontal dual layer of N doped polysilicon 20 and silicide 46 linked up with the polysilicon sidewall 32. Metal 54 makes electrical silicide 44. In a similar fashion, metal 50 makes ohmic connection to the collector 14 via the N+ collector reach-through region 16. All the metal contacts are suitably insulated to preventing shorting by means of an oxide passivation layer 48.

The manner in which the bipolar device shown in FIG. 8 is fabricated will now be described with reference to FIGS. 1-8. Referring now more particularly to FIG. 1, this Figure illustrates one small and greatly enlarged portion of semiconductor silicon body which will be used to form a very dense, high performance bipolar integrated circuit. However, it will be understood that semiconductor materials other than silicon can be used in conjunction with this process. The process described with reference to FIGS. 1-8 results in an NPN transistor. It should, however, be understood that the conductivity type shown in the drawings are selected for illustrative purposes and that opposite conductivity types could as readily be employed so as to realize a PNP sidewall emitter transistor. Finally, the impurity concentrations may be increased or decreased, as desired, in a manner familiar to one skilled in the art in accordance with the specific desired performance criteria of the transistor.

Typically, a P— substrate 10 of monocrystalline silicon has an N+ subcollector 12 therein. An epitaxial N— layer 14 is then grown on top of the substrate 10. These processes are standard processes in the formation of bipolar transistors. The substrate is typically a <100> crystallographic orientation silicon wafer having a resistance of about 10–20 ohm-cm. Subcollector diffusion is typically formed using arsenic having a surface concentration of about $1 \times 10^{20}$ atoms/cc The epitaxial growth process to form layer 14 may be any conventional technique such as silicon tetrachloride/hydrogen or silane mixtures at suitable temperatures. During the epitaxial growth, the dopant in the N+ layer moves into the epitaxial layer to fully form the subcollector region 12 as illustrated in FIG. 1. The thickness of the epitaxial layer for highly dense integrated circuits is about 1-3 microns. The preferred dopant concentration in the epitaxial layer 14 is typically about $1\times10^{16}$–$1\times10^{17}$ atoms/cc.

Next, forming an apertured mask on the epitaxial layer 14, the collector reach-through 16 is formed by introducing N type dopant therethrough into the exposed layer 14 to intercept the N+subcollector 12.

The next series of steps involve the formation of device isolation regions (not shown) to isolate the device active region from the remainder of the substrate. The isolation may be partial or complete dielectric isolation involving dielectric materials such as silicon dioxide and glass. There are many ways in the prior art to form the dielectric isolation regions of this type. It is preferred to use the process described in U.S. Pat. No. 4,104,086 issued to J. A. Bondur et al. and assigned to the present assignee.

Continuing with reference to FIG. 1, a 3000–7000 Å A thick silicon dioxide layer 18 is formed, for example, by chemical vapor deposition (CVD) on the surface 17 of the epi layer 14, followed by forming a layer 20 of polysilicon. The polysilicon layer 20 is doped N type and is typically of thickness in the range 1000–4000 Å. Next, using patterned photoresist 22 and reactive ion etching the layers 18 and 20 are defined into a mandrel 24 (shown only partially in FIG. 1) having substantially vertical walls 26.

Next, referring to FIG. 2, the transistor's shallow intrinsic base region 28 is formed. The base is formed such that it laterally extends substantially into the epi layer 14 to a distance under the oxide 18. In other words, this step is accomplished such that the base width (which is the shortest distance between the emitter—that would be formed in due course in layer 14 near the wall 26—and the collector) in the active area of the base and the parasitic sidewall are comparable. This is an important requirement since otherwise, the base width under the oxide 18 will be smaller than that in the active region leading to punch-through on the base. The intrinsic base region 28 may be formed by a single or multiple P type ion implantation. In single implant approach, boron of dose $1\times10^{13}$– $1\times10^{15}$ ions/sq. cm. and dose energy 5–20 Kev may be used. Following implantation, by thermal treatment the dopant is caused to diffuse both laterally underneath the oxide 18 and vertically into the epi layer 14 to obtain the desired base width. In the multiple implantation approach, initially a part of the intrinsic base region is implanted using a low energy 5–20 Kev P type (e.g., boron) ions at a dose of $10^{12}$–$10^{14}$ ions/sq.cm., followed by driving in the dopant to laterally penetrate the epi layer 14 underneath the oxide 18. This implantation step is followed by a self-aligned pedestal implant using phosphorous ions at a peak energy in the range of 200–400 Kev and dose $10^{12}$–$10^{13}$ ions/sq. cm. so that the active base-collector junction underneath the oxide 18 is determined by the resultant of the pedestal implant and the initial base implant. The peak of the pedestal implant should be well below the base-collector junction. Intrinsic base formation is completed by a third implantation step analogous to the single implantation step described above. After the completion of the implantation steps, annealing is done to activate the dopant and set the base-collector junction depth to the value desired.

Regardless of whether single or multiple ion implantation approach is used for forming the intrinsic base, the energy of implantation and drive-in temperature are adjusted to render the base width as shallow as possible and maximize the current gain. The implantation dose(s) should be tailored to render the base concentration sufficiently high to avoid punch-through in the active region.

After forming the intrinsic base region 28, the emitter is then embedded within a portion of this base region. The emitter may be formed by ion implanting N type species such as arsenic into a surface portion of the region 28. A suitable screen oxide may be formed on the base 28 prior to emitter implant which is stripped after forming the emitter. In a preferred embodiment, as illustrated in FIGS. 3 and 4, the emitter is formed by diffusion of dopant from a doped polysilicon sidewall. To form the polysilicon sidewall, a layer of polysilicon 30 is formed. The layer 30 may be in-situ doped with N type dopant (e.g., arsenic). Alternatively, the polysilicon layer 30 may be undoped when it is formed. It is then N doped by arsenic ion implantation at a dose of $5\times10^{15}$–$5\times10^{16}$ ions/sq.cm. The energy of the implant is adjusted to keep the implant within the polysilicon layer 30. Then, by directional RIE, the polysilicon layer 30 is etched to establish a polysilicon sidewall 32 as a rail along the vertical surface 26 of the mandrel 24. The sidewall 32 will serve as the emitter contact and the dopant source for emitter fabrication. The thickness of the polysilicon 30 is dictated by the desired emitter area, the maximum thickness being less than the height of the mandrel 24 for good reproducibility of the sidewall 32. The RIE step to transform the polysilicon layer 30 into the sidewall 32 is continued, as indicated in FIG. 5, to recess the surface 17 corresponding to unmasked portion of the P doped region 28 recessed surface is designated by 34 in FIG. 5. As will be apparent in due course, the unmasked region 28 directly under the surface 34 will constitute the extrinsic base. The recess depth, designated by X in FIG. 5, is rendered to be more than the final emitter-base junction depth. The recess X is typically about 1000–1500 Å or about 2–3 times the emitter-base junction depth. This overetch of the doped region 28 will remove the emitter implant from the umasked surface 17 of region 28 if ion implantation is used to form the emitter. This overetch will keep the extrinsic base a sufficient distance away from the emitter while reducing the base series resistance.

After recessing (the extrinsic base precursor of the transistor) in this fashion, the structure is thermally oxidized, as illustrated in FIG. 6, to grow an oxide 36 on the silicon surface 34 and the N dope polysilicon sidewall 32 and layer 20. The oxide grown on the polysilicon will be thicker than that of silicon. Typical thickness range of the oxide 36 is 200–500 Å. During this thermal oxidation step, the N type dopant from the sidewall 32 is caused to diffuse into the epitaxial silicon thereunder and form a shallow and self-aligned N doped emitter 38. The lightly P doped region 40 directly underneath the emitter 38 will serve as the intrinsic base of the transistor. The remainder of the P doped region 28 will constitute the extrinsic base precursor. The temperature and period of thermal oxidation (or dopant drive-in) is controlled such that the emitter-base junction depth is typically about 400–600 $=21$.

Continuing with the sidewall emitter transistor of the extrinsic base 42 (FIG. 6). The extrinsic base 42 is formed by implanting P type ions through the oxide 36 into the extrinsic base precursor 28. The dose and energy of the ions implantation for forming the extrinsic base should be tailored such that the dopant concentration in the extrinsic base region 42 will be high enough to avoid Schottky contact between the base silicide (that will be formed next) and the extrinsic base, but low enough so as not cause tunneling across the extrinsic base to emitter junction. In one example, boron ions of energy 20-40 Kev and dose $10^{14}$-$10^{15}$ ions/sq. cm. may be used in this step to cause penetration of the P dopant into the collector 14 to a maximum depth of about 3000-4000 Å. During the extrinsic base implant some of the P dopant will enter the N doped emitter polysilicon sidewall 32 and the horizontal polysilicon link 20, but since the dose of this implant is low compared to the emitter implant (if emitter is formed by ion implantation), it will have a negligible effect on the N dopant concentration in the polysilicon. Next, an anneal step at a temperature of about 800°-900° C. is carried out to activate the extrinsic base implant without causing migration of the implanted species. Furnace anneal at the specified temperature or rapid thermal anneal may be employed.

After forming the extrinsic base, by directional RIE, the oxide 36 on the horizontal silicon and polysilicon surfaces is removed while maintaining a layer of oxide on the non-horizontal polysilicon surfaces. In other words, a layer of oxide 36' (also referred to herein as sidewall oxide) is maintained on the sidewall 32 as illustrated in FIG. 7. The sidewall oxide 36' separates the extrinsic base 42 from the emitter 38 and also prevents formation of silicide on the emitter polysilicon sidewall 32.

Next, as illustrated in FIG. 7, a layer of metal such as Pt, Ti, or Ni is deposited and it is reacted to form a silicide layer in the silicon areas. Specifically, silicide base contact 44 is formed on the extrinsic base region 42 and polycide emitter contact 46 is formed on the polysilicon layer 20. In this silicidation step care should be taken to ensure that all of the polysilicon 20 is not consumed. Since the polysilicon sidewall 32 is covered by the oxide 36', no polycide is formed thereon. In this manner, self-aligned -silicide base contact and polycide emitter contact are established in a single step.

Referring to FIG. 8, next, to establish collector contact, which is done via the reach-through 16, an opening is made in the oxide 18 and polysilicon 20 in correspondence with the reach-through 16. A thick passivation layer of silicon dioxide 48 is formed over the entire structure. Contact holes are formed in the oxide 48 and conductive (e.g., metal) contacts 50, 52 and 54 with the collector, emitter and base, respectively, are established in a conventional manner such as by liftoff technique.

It is critical that the silicide on the extrinsic base region 42 does not react around the silicon corner 56 near the emitter 38 and extrinsic base 42 and reach the emitter. The recess/depth of the extrinsic base below the general surface of the epitaxial layer 14 should be at least 1000 Å. The depth is adjusted so that the intrinsic base implant is not pinched off. It should be kept shallower than the base-collector junction. In this regard, what is more critical is that either or both of the above junction depths should be tailored to prevent emitter-base leakage than reduce the base resistance, because the extrinsic base by itself can probably help reduce the base resistance. The surface of the extrinsic base is recessed to a depth more than the emitter-base junction depth, but less than the intrinsic base-collector junction depth.

Figure 9:
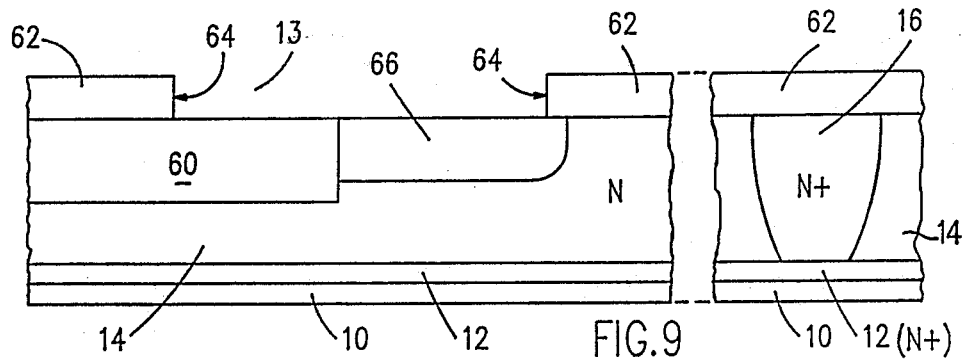
FIGS. 9-13 are cross-sectional representations of the sequential stages of fabrication of a second embodiment of the sidewall emitter transistor in accordance with the invention culminating in the new structure shown in FIG. 13.
Figure 10:
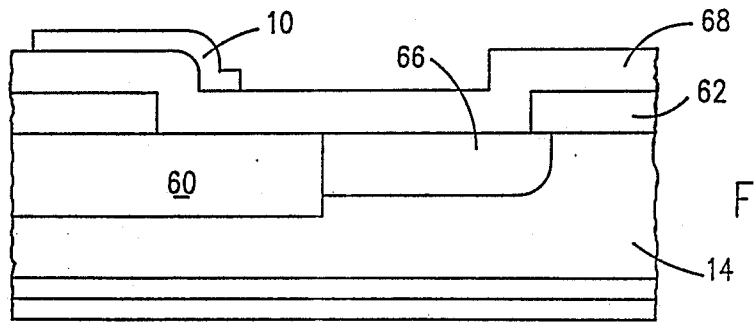
Figure 11:
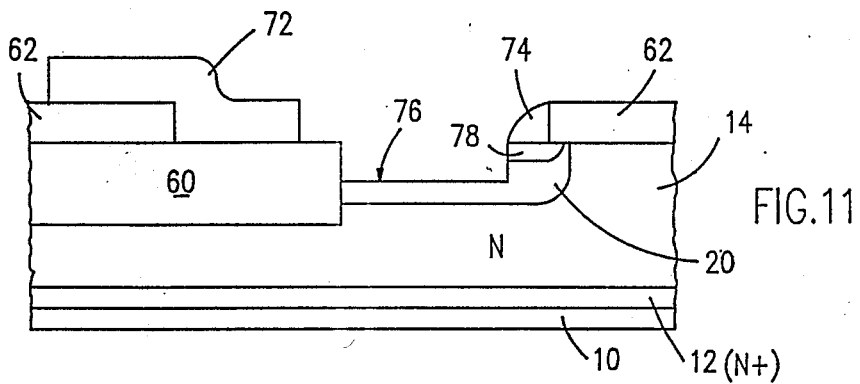
Figure 12:
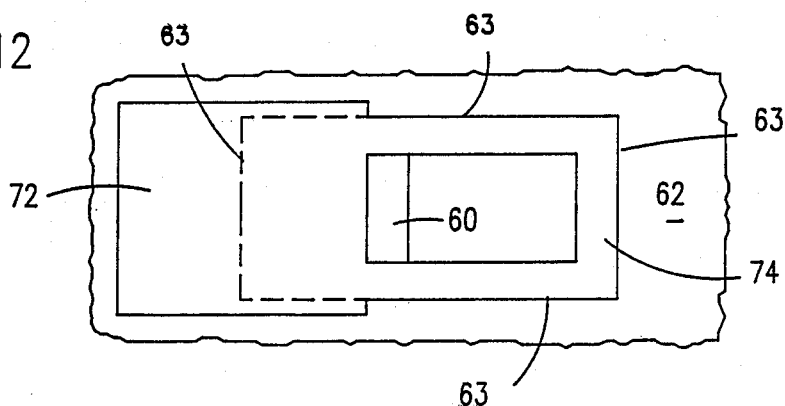
Figure 13:
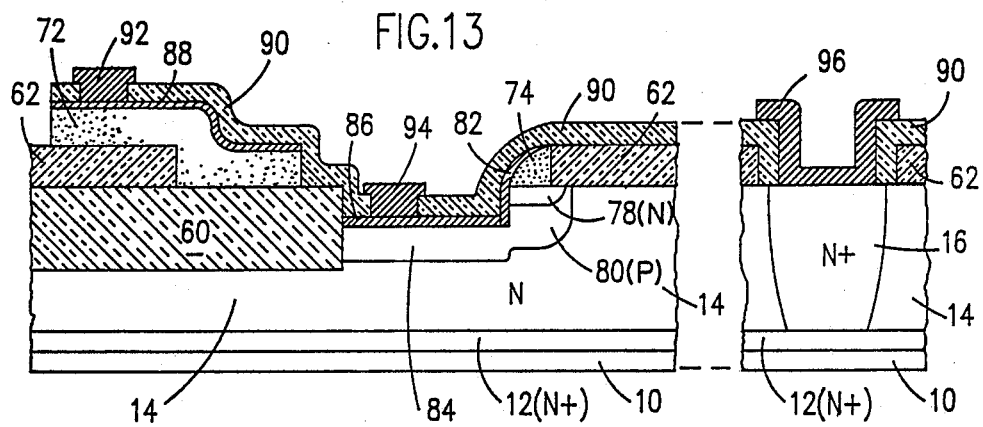
Figure 14:
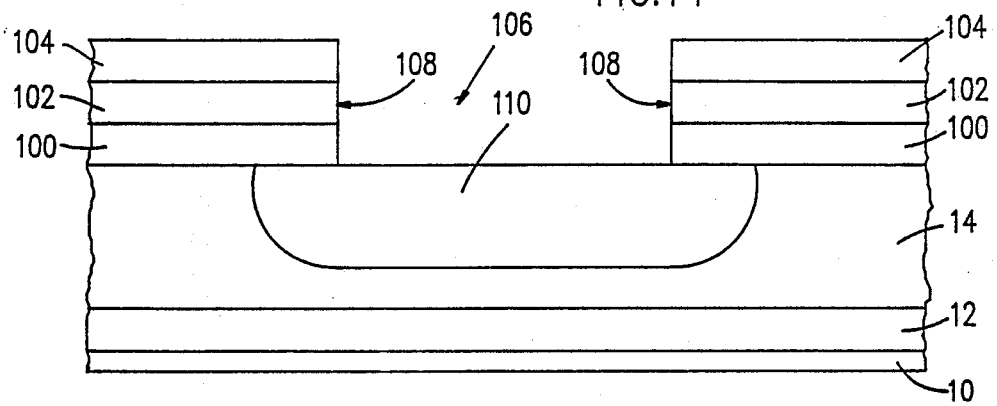
FIGS. 14-17 are cross-sectional representations of the sequential stages of fabrication of a third embodiment of the sidewall emitter transistor in accordance with the invention culminating on the novel structure shown in FIG. 17.

In a second embodiment of the invention, which is illustrated in FIGS. 9-13 and wherein like numerals designate similar elements as those in FIGS. 1-8, a shallow dielectric isolation region 60 is formed on a selected surface portion of the epitaxial layer 14. Typically, the isolation 60 is a recessed oxide trench isolation. Thereafter, an oxide layer 62 is deposited and patterned to have an opening 63 therein with substantially vertical walls 64 as indicated in FIG. 9. The intrinsic base 66 is implanted as described in connection with the base 28 of the first embodiment. An N doped polysilicon layer 68 is deposited. A mask 70 is then formed on the polysilicon 68 to cover the portion of the polysilicon 68 over the oxide 62. Then, by RIE, the polysilicon 68 is defined into a polysilicon portion 72 and polysilicon sidewall 74. The polysilicon portion 72 is needed for making a conductive contact with the emitter since the emitter polysilicon sidewall 74 is too narrow. Further, this approach facilitates forming emitter contact away from the region of transistor action. The polysilicon portions 72 and 74 constitute an integral part since the polysilicon sidewall 74 is formed on all the three sides of the opening 63 in the oxide 62. This feature is illustrated in FIG. 12 which is a top view of the polysilicon structure. The remainder of the process steps track the process steps described in connection with the first embodiment. This includes recessing the extrinsic base below the major surface of the epi layer (the layer 14), forming the self-aligned emitter 78 by diffusing the dopant from the polysilicon sidewall 74 into a portion of the intrinsic base, thereby also forming the intrinsic base 80, growing an oxide on all the exposed polysilicon and episilicon surfaces and reactive ion etching the grown oxide to leave an oxide cover 82 on the sidewall 74, forming the extrinsic base 84, establishing self-aligned silicide 86 in the extrinsic base 84 and polycide 88 in the emitter polysilicon 72, making an opening in the oxide 62 in correspondence with the collector reach-through 16, forming an oxide passivation layer 90, making contact openings in the layer 90 and forming conductive contacts 92, 94 and 96 with the emitter, base and collector, respectively.

In a third embodiment of the invention, which is illustrated in FIGS. 14-17, starting with a semiconductor substrate 10 having a subcollector 12 and epitaxial layer 14 analogous to that discussed in connection with FIG. 1, an oxide isolation layer 100 and a polysilicon, silicide, polycide or refractory metal layer 102 are formed. The polycide layer is formed by depositing a layer of N doped polysilicon followed by deposition of a refractory metal layer and sintering the two. If the layer 102 is silicide a refractory metal, it is deposited directly on the oxide 100. Polycide is preferred to polysilicon since it renders the emitter contact resistance very low.

Next, an oxide layer 104 is formed on layer 102 and the three layers 100, 102 and 204 are RIE'd to form an opening 106 therein having substantially vertical walls 108.

Figure 15:
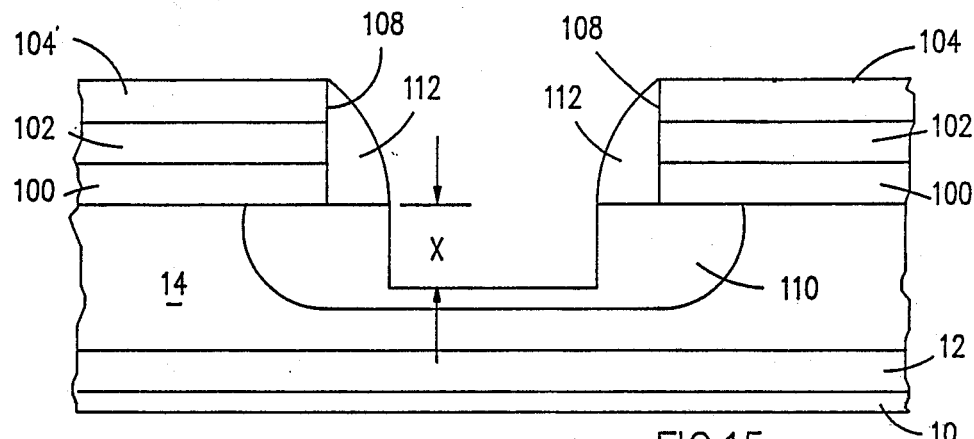
Figure 16:
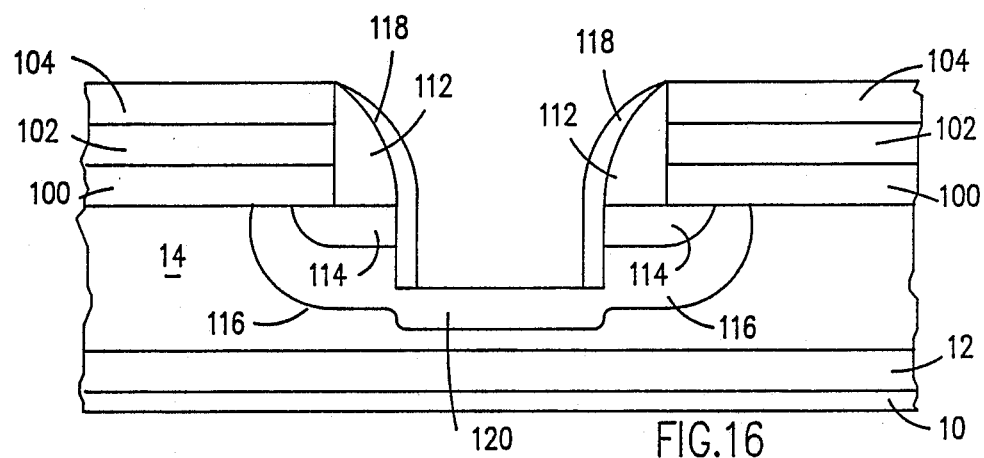
Figure 17:
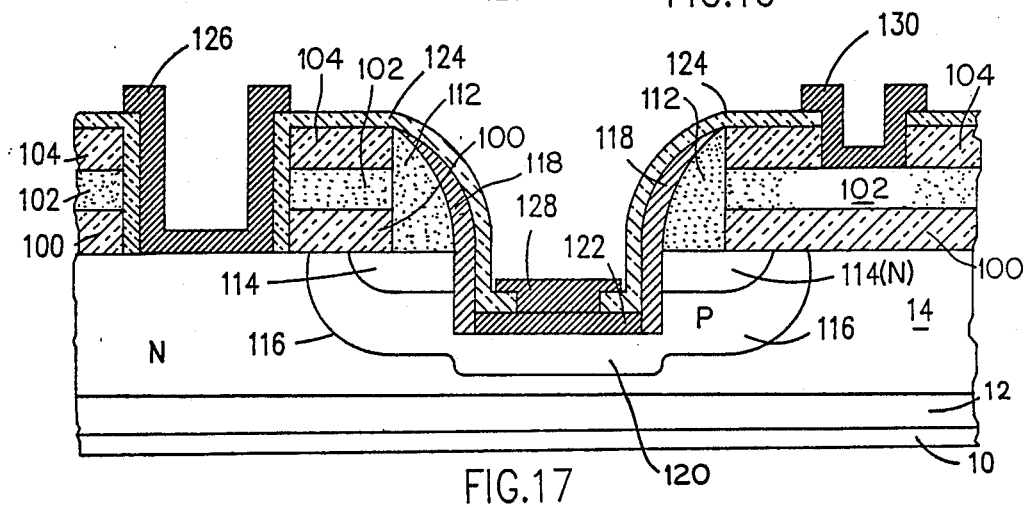

Next, as indicated in FIG. 15, submicron-wide doped polysilicon sidewalls 112 are established on the vertical surfaces 108 as described in connection with formation of sidewall 32 in FIG. 4. The polysilicon sidewalls 112, which are formed as a ring in the interior of the opening 106, serve to form the self-aligned emitter, self-aligned emitter contact and link the emitter to the conductor 102, the latter enabling electrical contact to the emitter at a place away from the device active region. The remainder of the process steps are quite analogous to those described in conjunction with the first embodiment hereinabove. Referring to FIGS. 16 and 17, these steps include reactive ion etching to recess the unmasked base region 110 to a depth X below the surface of the epitaxial layer 14, diffusing the N dopant from the sidewall 112 into the underlying intrinsic base region to form the self-aligned emitter ring 114 while simultaneously forming the intrinsic base 116 directly below the emitter 114, forming an oxide cover on the polysilicon sidewalls 112, implanting the P type extrinsic base 120, forming the self-aligned base silicide 122, forming a passivation oxide layer 124 and establishing conductive contacts 126, 128 and 130 with the collector 14, extrinsic base 120 and emitter 114, respectively.

Thus, there has been provided a novel transistor in which the emitter is formed from a conductive sidewall material which serves as self-aligned emitter contact. Since the size of the emitter is not dependent on lithography, the emitter is of extremely small (submicron) width (less than 0.5 microns) and has a tight tolerance. The transistor has a low emitter resistance, low emitter-base capacitance, low base resistance and low basecollector capacitance. Since the device is fully self-aligned, it enhances the device integration density on the semiconductor chip.

While the invention has been described in conjunction with specific preferred embodiments, it is evident that many alternatives, modifications and variations will be apparent to those skilled in the art in light of the foregoing description. While the integrated circuit structure and the associated fabrication process has been described in the context of silicon technology, other compatible materials like gallium arsenide as well as certain superconducting materials may be readily employed. It is therefore contemplated that the appended claims will embrace any such alternatives, modifications and variations as fall within the true scope and spirit of the invention.

What is claimed is:

1. A process for forming a vertical bipolar transistor comprising:
   providing a semiconductor substrate having a first conductivity type epitaxial layer thereon;
   forming an insulator-conductor dual layer having at least one substantially vertical surface on said epitaxial layer;
   forming a second conductivity type intrinsic base region in a surface portion of said epitaxial layer adjacent said wall;
   forming a first conductivity type doped material on said epitaxial layer as a sidewall abutting said vertical surface;
   anisotropically etching to recess epitaxial layer not masked by said sidewall and said dual layer below the surface of the remainder of said epitaxial layer;
   forming a first conductivity type emitter by diffusing dopant from said sidewall into a surface portion of the intrinsic base in correspondence with said sidewall;
   establishing a second insulator on said sidewall; and
   forming a second conductivity type extrinsic base in a surface portion of said recessed epitaxial layer.

2. The process as in claim 1 wherein said etching step including forming a substantially vertical surface in said epitaxial layer in correspondence with said sidewall.

3. The process as in claim 2 further comprising forming said second insulator on said vertical surface of the epitaxial layer in conjunction with forming said insulator on said sidewall.

4. The process as in claim 3 further comprising forming a self-aligned conductive silicide layer on said extrinsic base.

5. The process as in claim 1 wherein said recess is substantially below said emitter diffusion.

6. The process as in claim 1 further comprising a self-aligned conductive silicide formed on said conductor.

7. The process as in claim 1 wherein said conductor is selected from a group consisting of polysilicon, polycide and silicide.

8. The process as in claim 1 wherein said sidewall is composed of polysilicon.

9. The process as in claim 3 wherein said second insulator is silicon dioxide.

10. The process as in claim 21 wherein said epitaxial layer constitutes the collector of said transistor.

11. A process for forming a vertical bipolar transistor comprising:
    providing a semiconductor substrate having thereon a first conductivity type epitaxial layer and an isolation material recessed into a portion of said layer;
    forming thereon a first insulator layer having an opening with substantially vertical surfaces to expose only a portion of said recessed material and said layer;
    forming the intrinsic base by doping a surface portion of said epitaxial layer exposed by said opening with second conductivity type dopant;
    forming on said intrinsic base and isolation material a first conductivity type conductor layer comprised of an integral structure of a sidewall thereof established on at least one of said vertical surfaces in correspondence with said base and a pad thereof established on said isolation material and said first insulator;
    recessing the intrinsic base portion not masked by said first insulator and conductor;
    forming a first conductivity type emitter by diffusing dopant from said conductor sidewall into a surface portion of said intrinsic base thereunder, said sidewall serving as self-aligned contact to said emitter;
    establishing a second insulator on said sidewall; and
    forming the extrinsic base by doping said recessed intrinsic base with dopant of second conductivity type.

12. The process as in claim 11 wherein said emitter is diffused to a depth substantially less than the depth of said recessed intrinsic base portion.

13. The process as in claim 11 further comprising forming a self-aligned conductive silicide base contact layer on said extrinsic base.

14. The process as in claim 11 wherein conductor layer is composed of polysilicon.

15. The process as in claim 14 further comprising forming a self-aligned conductive silicide layer on said pad.

16. The process as in claim 15 further comprising establishing conductive contact with said pad for contacting said emitter.

17. The process as in claim 13 further comprising making electrical contact with said base contact layer.

18. The process as in claim 11 wherein said step of establishing second insulator on said sidewall comprises:
   forming a layer of said second insulator by thermal oxidation of said sidewall and said recessed portion; and
   reactive ion etching to remove said second insulator from all substantially horizontal surfaces.

19. The process as in claim 11 wherein said intrinsic base is formed by multiple ion implantation steps.

20. A process for forming a high performance transistor comprising:
   providing a semiconductor substrate having a first conductivity type collector region thereon; forming an insulator-conductor-insulator multiple layer having an opening with substantially vertical surfaces on said collector;
   forming a second conductivity type intrinsic base region in a surface portion of said collector by introducing dopant through said opening;
   forming a sidewall of doped material on said vertical surfaces;
   recessing the intrinsic base not masked by said multiple layer and said sidewall;
   forming a first conductivity type emitter by diffusing dopant from said sidewall into a surface portion of the intrinsic base directly under said sidewall;
   forming a second insulator on said sidewall; and
   forming the extrinsic base of said transistor by introducing dopant into the recessed intrinsic base portion not masked by second insulator.

21. The process as in claim 40 wherein said conductor is selected from a group consisting of polysilicon, silicide, polycide or refractory metal.

22. The process as in claim 20 wherein said sidewall is composed of polysilicon.

23. The process as in claim 20 wherein said second insulator is silicon dioxide.

24. The process as in claim, 23 wherein said oxide is formed by thermal oxidation of said polysilicon.

25. The process as in claim 20 wherein said recess is substantially below the depth of said emitter.

26. The process as in claim 20 further comprising forming a self-aligned conductive silicide on said extrinsic base.

27. The process as in claim 20 further comprising establishing a conductive contact with said emitter by forming a conductive with said conductor layer at a distance laterally away from the emitter.

28. The process as in claim 20 further comprising establishing base contact interior to said opening.

29. A process for forming a high performance vertical transistor comprising:
   providing a silicon substrate having a first conductivity type collector on a surface portion thereof;
   forming a multiple layer composed of insulator, first conductivity doped polysilicon and oxide, said layer having an opening with substantially vertical surfaces;
   forming the intrinsic base of said transistor by implanting a surface portion of said collector through said opening with second conductivity type ions;
   introducing first conductivity type dopant into a surface portion of said intrinsic base to form an emitter precursor;
   forming a first conductivity type conductive sidewall in said vertical surfaces to contact said precursor;
   forming an insulator on said sidewall;
   etching away said precursor and a surface portion of said intrinsic base not masked by said sidewall and the insulator thereon, thereby forming the emitter; and
   forming by second conductivity type ion implantation the extrinsic base in said etched intrinsic base.

30. The process as in claim 29 further comprising forming a layer of refractory metal silicide on said extrinsic base and establishing base contact on said silicide.

31. The process as in claim 30 wherein said conductive sidewall is either polysilicon, polycide or silicide.

32. The process as in claim 31 further comprising forming emitter contact by establishing conductive contact with said polysilicon.

* * * * *

UNITED STATES PATENT AND TRADEMARK OFFICE
CERTIFICATE OF CORRECTION

PATENT NO. : 4,916,083

DATED : April 10, 1990

INVENTOR(S) : Michael D. Monkowski and Joseph F. Shepard

It is certified that error appears in the above-identified patent and that said Letters Patent is hereby corrected as shown below:

On the title page:
In the abstract, after the last line, add:

"Extrinsic base is implanted into the exposed recessed intrinsic base. A self-aligned silicide layer is formed on the extrinsic base as also on the horizontal polysilicon layer linked with the sidewall."

Column 6, line 65, change "400-600 =" to "400-600 Å"

Claim 21, line 1, change "claim 40" to "claim 20"

Signed and Sealed this

Fifth Day of May, 1992

Attest:

DOUGLAS B. COMER

Attesting Officer

Acting Commissioner of Patents and Trademarks